(12) United States Patent
Wang

(10) Patent No.: US 11,282,898 B2
(45) Date of Patent: Mar. 22, 2022

(54) DISPLAY SUBSTRATE, METHOD FOR MANUFACTURING SAME, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Bo Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 113 days.

(21) Appl. No.: 16/646,876

(22) PCT Filed: Apr. 18, 2019

(86) PCT No.: PCT/CN2019/083234
§ 371 (c)(1),
(2) Date: Mar. 12, 2020

(87) PCT Pub. No.: WO2019/237828
PCT Pub. Date: Dec. 19, 2019

(65) Prior Publication Data
US 2020/0279893 A1 Sep. 3, 2020

(30) Foreign Application Priority Data
Jun. 12, 2018 (CN) .......................... 201810600688.5

(51) Int. Cl.
*H01L 27/32* (2006.01)

(52) U.S. Cl.
CPC ...... *H01L 27/3218* (2013.01); *H01L 27/3246* (2013.01); *H01L 27/3276* (2013.01)

(58) Field of Classification Search
CPC ............. H01L 27/3218; H01L 27/3246; H01L 27/3276; H01L 27/32
(Continued)

(56) References Cited

U.S. PATENT DOCUMENTS

| 2016/0056218 A1 | 2/2016 | Wang et al. | |
| 2016/0120005 A1* | 4/2016 | Wu | H05B 33/26 313/505 |

(Continued)

FOREIGN PATENT DOCUMENTS

| CN | 104241329 A | 12/2014 |
| CN | 104752490 A | 7/2015 |

(Continued)

OTHER PUBLICATIONS

First Office Action for Chinese Application No. 201810600688.5, dated Aug. 1, 2019, 10 Pages.
(Continued)

*Primary Examiner* — Didarul A Mazumder
(74) *Attorney, Agent, or Firm* — Brooks Kushman P.C.

(57) ABSTRACT

Embodiments of the present disclosure provide a display substrate, a method for manufacturing the same, and a display apparatus. The display substrate comprises a plurality of sub-pixels, which comprises one or more first sub-pixels located in an effective display area of the display substrate, and one or more second sub-pixels located at a boundary of the effective display area of the display substrate, wherein the second sub-pixel comprises a first portion in the effective display area and a second portion outside the effective display area, and the second portion does not emit light when the display substrate is performing display.

20 Claims, 5 Drawing Sheets

(58) Field of Classification Search
USPC .................................... 257/40; 438/82, 99
See application file for complete search history.

(56) References Cited

U.S. PATENT DOCUMENTS

| | | |
|---|---|---|
| 2017/0104042 A1 | 4/2017 | Wang et al. |
| 2017/0236882 A1 | 8/2017 | Matsunaga et al. |
| 2017/0294491 A1* | 10/2017 | Jo ........................ G09G 3/2003 |

FOREIGN PATENT DOCUMENTS

| | | | |
|---|---|---|---|
| CN | 206441731 U | | 8/2017 |
| CN | 108039358 A | * | 5/2018 ............. H01L 27/32 |
| CN | 108039358 A | | 5/2018 |
| CN | 108550616 A | | 9/2018 |
| CN | 108565281 A | | 9/2018 |
| CN | 208336232 U | | 1/2019 |
| JP | 2004186001 A | | 7/2004 |

OTHER PUBLICATIONS

International Search Report and Written Opinion for Application No. PCT/CN2019/083234, dated Jul. 18, 2019, 12 Pages.

* cited by examiner

DISPLAY SUBSTRATE, METHOD FOR MANUFACTURING SAME, AND DISPLAY DEVICE

CROSS-REFERENCE TO RELATED APPLICATIONS

This application is the U.S. national phase of PCT Application No. PCT/CN2019/083234 filed on Apr. 18, 2019, which claims priority to Chinese Patent Application No. 201810600688.5 filed on Jun. 12, 2018, which are incorporated herein by reference in their entireties.

TECHNICAL FIELD

The present disclosure relates to the field of display technology, and in particular to an Organic Light-Emitting Diode (OLED) display substrate, a method for manufacturing the same, and a display device.

BACKGROUND

At present, users have increasingly higher requirements for display devices, and most of them require the display devices to be lighter, thinner, brighter, and more energy efficient. Since an OLED display is self-luminous, and can achieve a display function without any additional backlight, it has become a premier choice of a lighter and thinner display. Meanwhile, there is an increasing market demand for specially-shaped displays, including display products with rounded corners, such as round watches, square displays with rounded corners, etc.

However, when a traditional circular OLED display is performing display, a jagged shape can appear at an edge of the circular display area, which will negatively affect a viewing experience of a user. In order to solve this problem, in many OLED displays, a driver Integrated Circuit (IC) is used to perform pixel compensation at the edge of the circular display area to alleviate the problem of the appearance of the jagged shape. However, this will increase power consumption of the driver IC as well as the cost of the OLED display.

SUMMARY

In a first aspect, embodiments of the present disclosure provide a display substrate, including a plurality of sub-pixels, which includes one or more first sub-pixels located in an effective display area of the display substrate, and one or more second sub-pixels located at a boundary of the effective display area of the display substrate. The second sub-pixel includes a first portion in the effective display area and a second portion outside the effective display area. The second portion does not emit light when the display substrate is performing display.

According to some embodiments of the present disclosure, the display substrate is an OLED display substrate.

According to some embodiments of the present disclosure, the sub-pixel includes an anode, a cathode, and an organic light-emitting layer located between the anode and the cathode, and in the second portion, the anode and the organic light-emitting layer are separated from each other by an insulating layer.

According to some embodiments of the present disclosure, the sub-pixel includes an anode, a cathode, and an organic light-emitting layer located between the anode and the cathode, and in the second portion, the cathode and the organic light-emitting layer are separated from each other by an insulating layer.

According to some embodiments of the present disclosure, the insulating layer includes a light-shielding material.

According to some embodiments of the present disclosure, the insulating layer includes an organic resin material.

According to some embodiments of the present disclosure, the insulating layer is in a same layer and made of a same material as a spacer of the display substrate.

According to some embodiments of the present disclosure, the effective display area has a boundary extending along a non-linear trace.

According to some embodiments of the present disclosure, the effective display area has a shape of a circle, an oval, a ring, a rectangle with rounded corners, an arc, or a hexagon.

According to some embodiments of the present disclosure, the sub-pixels are rectangular, square, diamond-shaped, or circular.

In a second aspect, embodiments of the present disclosure provide a display device including the display substrate as described in the first aspect.

According to some embodiments of the present disclosure, the display substrate is an OLED display substrate, and the display device is an OLED display device.

In a third aspect, embodiments of the present disclosure provide a method for manufacturing a display substrate which includes a plurality of sub-pixels, each of which includes an anode, a cathode, and an organic light-emitting layer located between the anode and the cathode. The plurality of sub-pixels includes one or more first sub-pixels located in an effective display area of the display substrate, and one or more second sub-pixels located at a boundary of the effective display area of the display substrate. The second sub-pixel includes a first portion in the effective display area and a second portion outside the effective display area. The method includes: forming an insulating layer between the anode and the organic light-emitting layer in the second portion; and/or forming an insulating layer between the cathode and the organic light-emitting layer in the second portion.

According to some embodiments of the present disclosure, the display substrate is an OLED display substrate.

According to some embodiments of the present disclosure, the insulating layer and a spacer of the display substrate are formed by a single patterning process.

According to some embodiments of the present disclosure, when in the second portion, the insulating layer is located between the anode and the organic light-emitting layer, the insulating layer is prepared after a pixel-defining layer of the display substrate has been formed.

According to some embodiments of the present disclosure, when in the second portion, the insulating layer is located between the cathode and the organic light-emitting layer, the insulating layer is prepared after the organic light-emitting layer has been formed and before the cathode is to be formed.

BRIEF DESCRIPTION OF THE DRAWINGS

In order to illustrate the technical solutions of the embodiments of the present disclosure more apparently, the accompanying drawings required in the description of the embodiments of the present disclosure will be briefly introduced below. It is evident that the drawings used in the following description relate to some embodiments of the present

DETAILED DESCRIPTION

In order to make the technical problems to be solved, technical solutions, and advantages of the embodiments of the present disclosure more apparent, detailed description will be set forth with reference to the accompanying drawings and specific embodiments.

At present, there is an increasing market demand for specially-shaped displays, including display products with rounded corners, such as round watches, square displays with rounded corners, etc.

Figure 1:
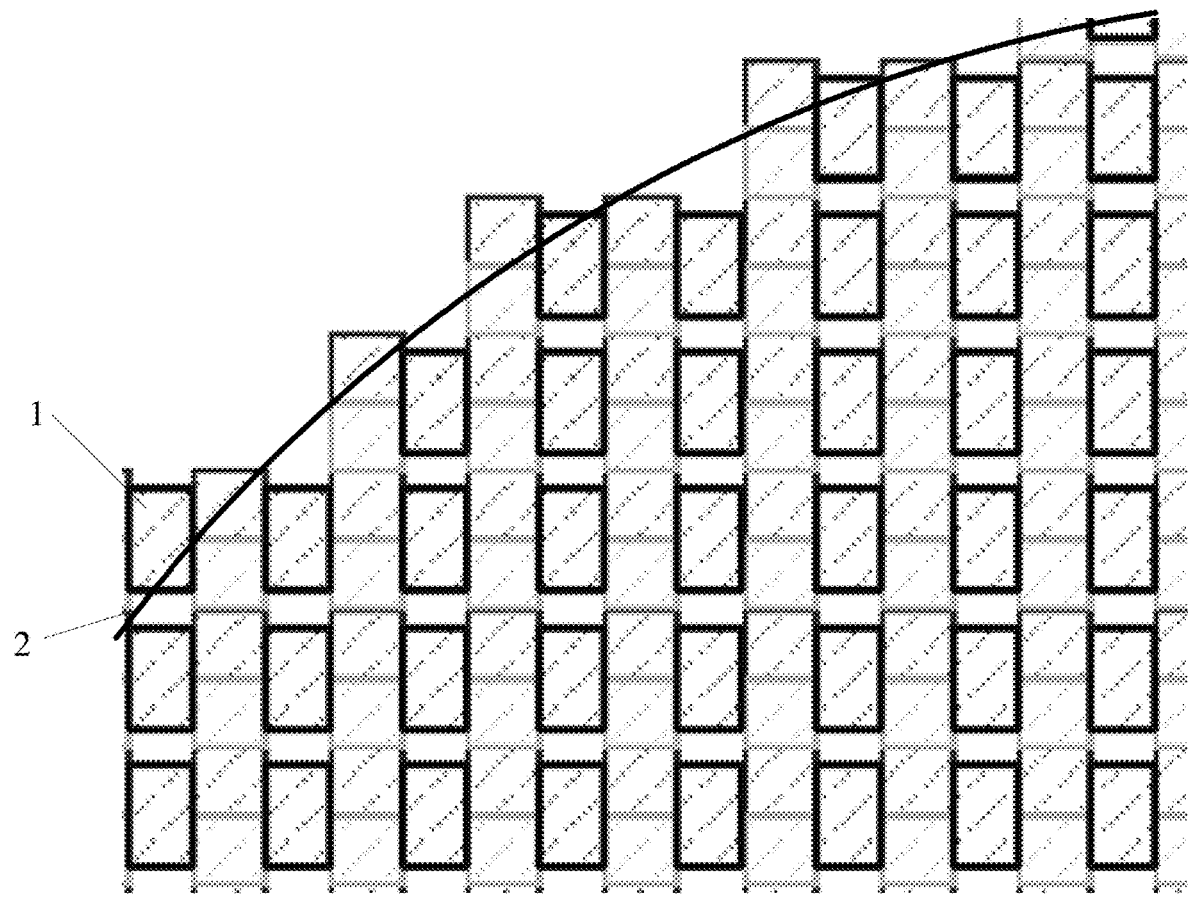
FIG. 1 is a schematic diagram showing a case where a jagged shape appears at an edge of a circular display area in related art.

However, as shown in FIG. 1, when a traditional circular OLED display is performing display, a jagged shape can appear at an edge of the circular display area, which will affect a viewing experience of a user. In order to solve this problem, in many OLED displays, a driver Integrated Circuit (IC) is used to perform pixel compensation at the edge of the circular display area to alleviate the problem of the appearance of the jagged shape. However, this will increase power consumption of the driver IC as well as the cost of the OLED display.

To solve the above problem, embodiments of the present disclosure provide an OLED display substrate, a method for manufacturing the same, and a display device, which are capable of implementing a specially-shaped display at low cost.

Embodiments of the present disclosure provide a display substrate, including a plurality of sub-pixels, which includes one or more first sub-pixels in an effective display area of the display substrate, and one or more second sub-pixels located at a boundary of the effective display area of the display substrate. The second sub-pixel includes a first portion in the effective display area and a second portion outside the effective display area. The second portion does not emit light when the display substrate is performing display. As a non-limiting example, the display substrate is an OLED display substrate. Of course, it can be understood by those skilled in the art that the display substrate may be any other suitable display substrate of a known or unknown type, and the embodiments of the present disclosure are not limited thereto.

A detailed description will be given hereinafter by taking a case in which the display substrate is an OLED display substrate as an example.

In this embodiment, the sub-pixel located at the boundary of the effective display area of the OLED display substrate includes a first portion in the effective display area and a second portion outside the effective display area. When the OLED display substrate is performing display, the second portion does not emit light. That is, the portion of the sub-pixel outside the effective display area of the OLED display substrate does not emit light, but other portion of the sub-pixel in the effective display area of the OLED display substrate emits light. As a result, even if the effective display area of the OLED display substrate has a shape of a circle, an oval or any other shape rather than a rectangular shape, there will be no jagged shape at the edge of the effective display area during the display, and the viewing experience of the user will not be adversely affected. That is to say, pixel compensation will be not necessary at the edge of the effective display area to alleviate the problem of the appearance of the jagged shape, the power consumption of the driver IC will not be increased, and the specially-shaped display can be achieved at low cost. In addition, by designing the shapes of the first and second portions of the second sub-pixel, it is possible to allow the edge of the effective display area to extend along a non-linear trace, thereby providing various specially-shaped displays. For example, the shape of the specially-shaped display includes a circular shape, a substantially circular shape, an oval shape, an annular shape, and so on.

In the case of an OLED display substrate, the principle of light emission is that an organic light-emitting layer between an anode and a cathode emits light under an electric field between these two electrodes, and the driving of the light emission needs to be achieved by the two electrodes, and one of the electrodes is a transparent electrode for enabling light generated by the organic light-emitting layer to be emitted to the outside of the screen, and the other electrode is a mirror reflection electrode that can realize a microcavity structure of the OLED display substrate, which makes the light generated by the organic light-emitting layer resonate and reflects the light generated by the organic light-emitting layer to emit towards a side where the transparent electrode is.

There are many ways to make the second portion not emit light when the OLED display substrate is performing the display. By way of example, the anodes in the first and second portions may be independent of each other, and the anode in the first portion is connected to a driving thin film transistor, and the anode in the second portion is not connected to the driving thin film transistor. In this way, when the OLED display substrate is performing the display, the second portion does not emit light since the anode in the second portion is not connected to the driving thin film transistor. Alternatively, the cathodes in the first and second portions may be independent of each other, and the cathode in the first portion is connected to a signal line, and the cathode in the second portion is not connected to the signal line. In this way, when the OLED display substrate is performing the display, the second portion does not emit light since the cathode in the second portion does not receive any electrical signal. Here, the type or size of an electrical signal connected to the anode or cathode in the first portion and the second portion can be designed according to actual needs as long as the second portion is controlled such that it does not emit light at all, or substantially does not emit light, and detailed description of this will not be provided here.

Of course, the way to make the second portion not emit light when the OLED display substrate is performing the display is not limited to those two ways as described above. Another relatively easy way is to provide an insulating layer between one of the electrodes and the organic light-emitting layer in the second portion to separate them from each other. In this way, when the OLED display substrate is performing the display, since the electrode and the organic light-emitting layer in the second portion are separated from each other by the insulating layer, the electrode is not in contact with the organic light-emitting layer and the organic light-emitting layer in the corresponding area cannot be driven to emit light, thereby achieving that the second portion does not emit light.

Figure 4A:
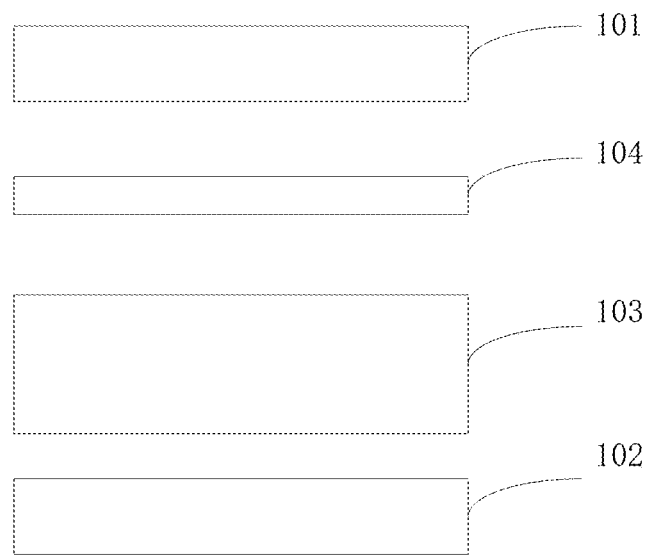
FIG. 4A is a first embodiment of a specific configuration of a sub-pixel according to embodiments of the present disclosure.

In a specific embodiment, as shown in FIG. 4A, the sub-pixel 1 includes an anode 101, a cathode 102, and an organic light-emitting layer 103 located between the anode 101 and the cathode 102, and the anode 101 and the organic light-emitting layer 103 are separated from each other by an insulating layer 104.

Figure 4B:
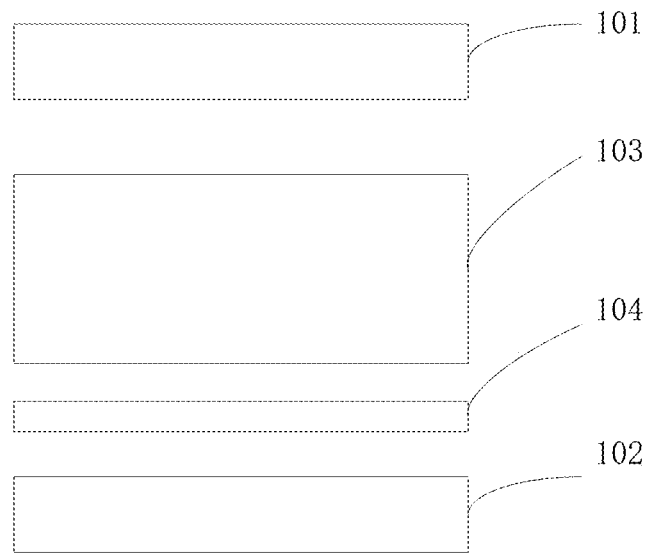
FIG. 4B is a second embodiment of a specific configuration of a sub-pixel according to embodiments of the present disclosure.

In another specific embodiment, as shown in FIG. 4B, the sub-pixel 1 includes an anode 101, a cathode 102, and an organic light-emitting layer 103 located between the anode 101 and the cathode 102, and the cathode 102 and the organic light-emitting layer 103 are separated from each other by an insulating layer 104.

Here, although gaps are shown between the individual components or layers in FIGS. 4A and 4B, it can be understood by those skilled in the art that this is for the purpose of distinctively showing the components or layers and such gaps do not have to be present. Rather, the individual components or layers shown may be in direct contact with one another, or there may be one or more additional components or layers between them.

For a liquid crystal display, a black matrix (BM) can be provided on a color filter substrate to define a specially-shaped effective display area, i.e., a non-rectangular effective display area. However, since there may be no water or oxygen on the organic light-emitting layer of the OLED display substrate, if the black matrix is used to shield the organic light-emitting layer, the black matrix may be placed on an encapsulating layer. In this way, there is a gap between the organic light-emitting layer and the black matrix, and light leakage may occur. In contrast, in the technical solution of this embodiment, the insulating layer is formed between one of the electrodes and the organic light-emitting layer in the second portion of the second sub-pixel, and the insulating layer is in contact with the organic light-emitting layer, which directly results in no light emission by the organic light-emitting layer in the second portion and no light leakage.

The insulating layer 104 can be made of an organic resin material. Specifically, it can be made of a transparent material or a light-shielding material. When the insulating layer is made of the light-shielding material, it is possible to effectively prevent light emitted in the effective display area from leaking out of the effective display area.

When the insulating layer 104 in the second portion 12 is located between the anode 101 and the organic light-emitting layer 103, the preparation of the insulating layer 104 can be carried out after a pixel-defining layer of the OLED display substrate has been formed. That is, after the preparation of the pixel-defining layer of the OLED display substrate has been completed, the preparation of the insulating layer on the anode in the second portion begins. The provision of the insulating layer will not increase the thickness of the OLED display substrate, and defines a shape of the effective display area. Moreover, the manufacturing process is simple and will not increase the difficulty of manufacturing the OLED display substrate.

When the insulating layer 104 in the second portion 12 is located between the cathode 102 and the organic light-emitting layer 103, the preparation of the insulating layer 104 can be carried out after the organic light-emitting layer 103 has been formed and before the cathode 102 is to be formed.

Optionally, the insulating layer 104 is in a same layer and made of a same material as a spacer of the OLED display substrate, so that the insulating layer 104 and the spacer of the OLED display substrate can be formed at the same time in a same single patterning process, and there is no need to form the insulating layer by an additional patterning process, which can result in the reduction of the number of patterning processes of the OLED display substrate and saving of the production cost of the OLED display substrate. When the insulating layer and the spacer of the OLED display substrate are formed at the same time by using the same single patterning process, it is necessary to modify a conventional mask for preparing the spacer of the OLED display substrate by adding a mask pattern for preparing the insulating layer.

In the technical solution of this embodiment, the phenomenon of the jagged shape at a peripheral edge of the circular effective display area can be improved without increasing much workload, and the technical solution of this embodiment is not limited to realizing the circular effective display area, but can provide an effective display area of any shape. Moreover, after practical verification, it has been proved that the display effect is very desirable. The technical solution of this embodiment is applicable to any effective display area having a boundary extending along a non-linear trace. To be specific, the effective display area may be circular or annular. Of course, the effective display area may alternatively have any other shape, such as a rectangle with rounded corners, an arc and a hexagon.

Specifically, in the technical solution of this embodiment, the sub-pixels may be rectangular. Of course, the shape of the sub-pixels is not limited to the rectangle, and may be other shapes, such as a diamond and a circle.

Figure 2:
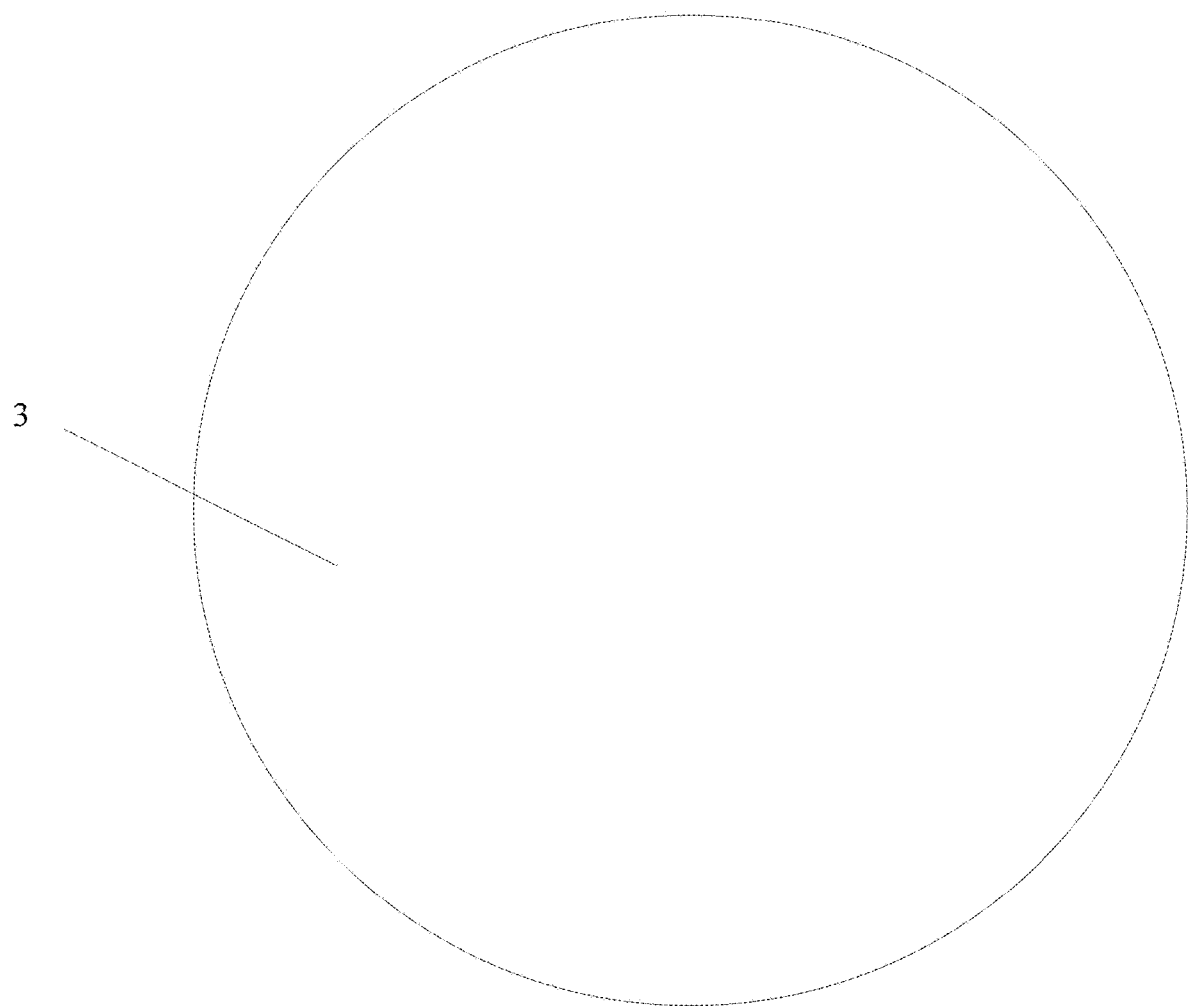
FIG. 2 is a schematic diagram showing a circular display area according to embodiments of the present disclosure.
Figure 3:
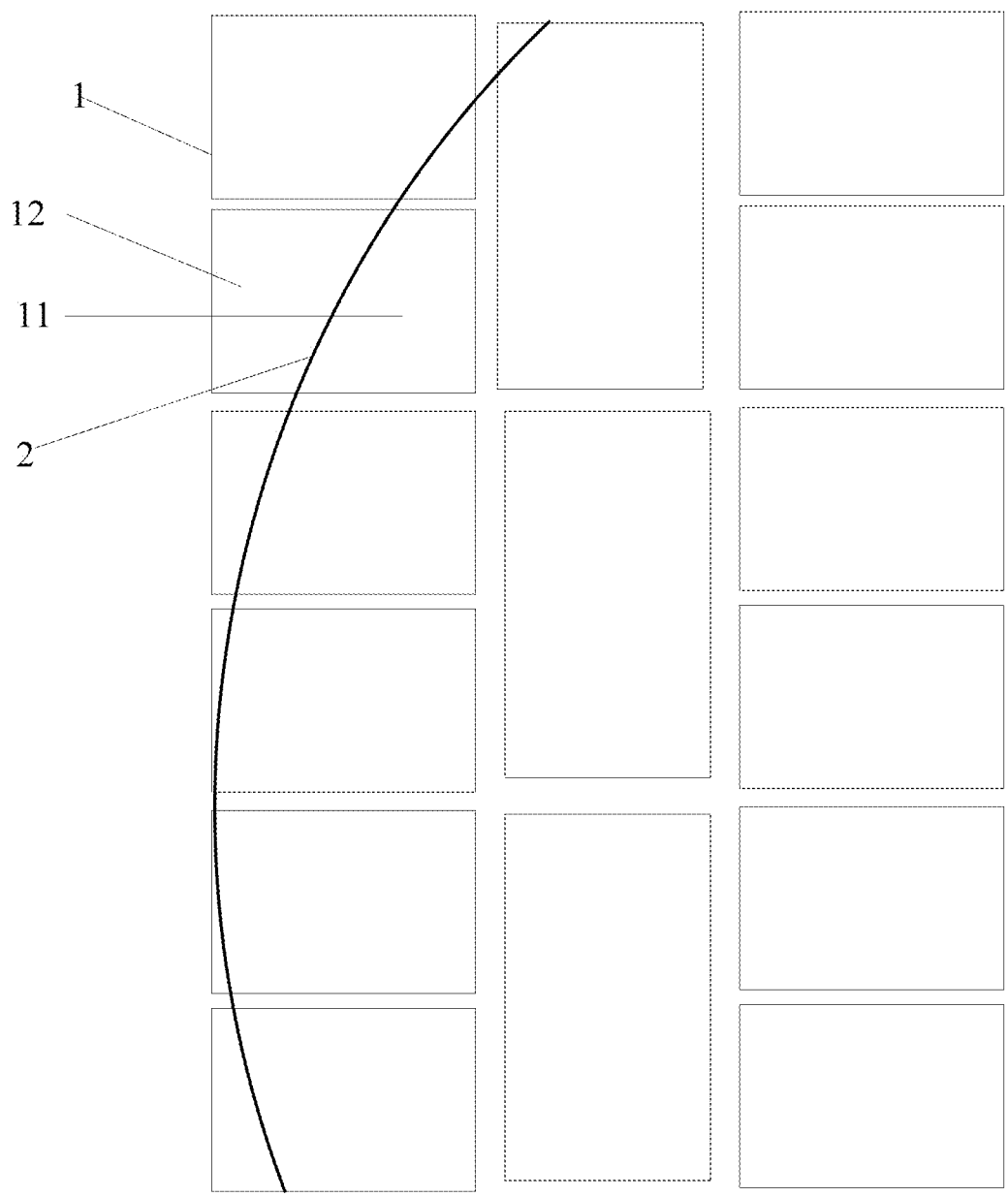
FIG. 3 is a schematic diagram showing that sub-pixels at the edge of a circular display area are divided into first portions and second portions according to embodiments of the present disclosure.

In a specific embodiment, as shown in FIGS. 2 and 3, the effective display area 3 of the OLED display substrate is circular, and the sub-pixel 1 that intersects a boundary line 2 of the effective display area is divided into a first portion 11 and a second portion 12. Moreover, the organic light-emitting layer and the anode in the second portion are separated from each other by an insulating layer, so that when the OLED display substrate is performing the display, the organic light-emitting layer in the second portion will not emit light, and a circular effective display area is thus realized.

An embodiment of the present disclosure further provides a display device including the OLED display substrate as described above. The display device may be any product or component having a display function, such as a television, a display, a digital photo frame, a mobile phone, and a tablet computer. The display device further includes a flexible circuit board, a printed circuit board, and a backplane.

In the display device of this embodiment, the sub-pixel at the boundary of the effective display area of the OLED display substrate includes a first portion in the effective display area and a second portion outside the effective display area. When the OLED display substrate is performing the display, the second portion does not emit light. That is, the portion of the sub-pixel outside the effective display area of the OLED display substrate does not emit light, but other portion of the sub-pixel in the effective display area of the OLED display substrate emits light. As a result, even if the effective display area of the OLED display substrate has a shape of a circle or any other shape rather than a rectangular shape, there will be no jagged shape at the edge of the effective display area during the display, and the viewing experience of the user will not be adversely affected. That is to say, pixel compensation will be not necessary at the edge of the effective display area to alleviate the problem of the appearance of the jagged shape, the power consumption of the driver IC will not be increased, and the specially-shaped display can be achieved at low cost.

An embodiment of the present disclosure further provides a method for manufacturing an OLED display substrate. The OLED display substrate includes a plurality of sub-pixels, and the sub-pixel includes an anode, a cathode, and an organic light-emitting diode layer located between the anode and the cathode. Furthermore, the plurality of sub-pixels includes one or more first sub-pixels in an effective display area of the OLED display substrate, and one or more second sub-pixels located at a boundary of the effective display area of the OLED display substrate. The second sub-pixel includes a first portion in the effective display area and a second portion outside the effective display area. The method includes: forming an insulating layer between the anode and the organic light-emitting layer in the second portion; and/or forming an insulating layer between the cathode and the organic light-emitting layer in the second portion.

In the case of an OLED display substrate, the principle of light emission is that an organic light-emitting layer between an anode and a cathode emits light under an electric field between these two electrodes, and the driving of the light emission needs to be achieved by the two electrodes, and one of the electrodes is a transparent electrode for enabling light generated by the organic light-emitting layer to be emitted to the outside of the screen, and the other electrode is a mirror reflection electrode that can realize a microcavity structure of the OLED display substrate, which makes the light generated by the organic light-emitting layer resonate and reflects the light generated by the organic light-emitting layer to emit towards a side where the transparent electrode is.

In this embodiment, the insulating layer is provided between one of the electrodes and the organic light-emitting layer in the second portion to separate them from each other. In this way, when the OLED display substrate is performing the display, since the electrode and the organic light-emitting layer in the second portion are separated from each other by the insulating layer, the electrode is not in contact with the organic light-emitting layer and the organic light-emitting layer in the corresponding area cannot be driven to emit light, thereby achieving that the second portion does not emit light. That is, the portion of the sub-pixel outside the effective display area of the OLED display substrate does not emit light, but other portion of the sub-pixel in the effective display area of the OLED display substrate emits light. As a result, even if the effective display area of the OLED display substrate has a shape of a circle or any other shape rather than a rectangular shape, there will be no jagged shape at the edge of the effective display area during the display, and the viewing experience of the user will not be adversely affected. That is to say, pixel compensation will be not necessary at the edge of the effective display area to alleviate the problem of the appearance of the jagged shape, the power consumption of the driver IC will not be increased, and the specially-shaped display can be achieved at low cost. In addition, by designing the shapes of the first and second portions of the second sub-pixel, it is possible to allow the edge of the effective display area to extend along a non-linear trace, thereby providing various specially-shaped displays.

For a liquid crystal display (LCD), a black matrix (BM) can be provided on a color filter substrate to define a specially-shaped effective display area, i.e., a non-rectangular effective display area. However, since there may be no water or oxygen on the organic light-emitting layer of the OLED display substrate, if the black matrix is used to shield the organic light-emitting layer, the black matrix may be placed on an encapsulating layer. In this way, there is a gap between the organic light-emitting layer and the black matrix, and light leakage may occur. In contrast, in the technical solution of this embodiment, the insulating layer is formed between one of the electrodes and the organic light-emitting layer in the second portion of the second sub-pixel, and the insulating layer is in contact with the organic light-emitting layer, which directly results in no light emission by the organic light-emitting layer in the second portion and no light leakage.

The insulating layer can be made of an organic resin material. Specifically, it can be made of a transparent material or a light-shielding material. When the insulating layer is made of the light-shielding material, it is possible to effectively prevent light emitted in the effective display area from leaking out of the effective display area.

When the insulating layer in the second portion is located between the anode and the organic light-emitting layer, the preparation of the insulating layer can be carried out after a pixel-defining layer of the OLED display substrate has been formed. That is, after the preparation of the pixel-defining layer of the OLED display substrate has been completed, the preparation of the insulating layer on the anode in the second portion begins. The provision of the insulating layer will not increase the thickness of the OLED display substrate, and defines a shape of the effective display area. Moreover, the manufacturing process is simple and will not increase the difficulty of manufacturing the OLED display substrate.

When the insulating layer in the second portion is located between the cathode and the organic light-emitting layer, the preparation of the insulating layer can be carried out after the organic light-emitting layer has been formed and before the cathode is to be formed.

Optionally, the insulating layer and a spacer of the OLED display substrate can be formed at the same time in a same single patterning process, and there is no need to form the insulating layer by an additional patterning process, which can result in the reduction of the number of patterning processes of the OLED display substrate and saving of the production cost of the OLED display substrate. When the insulating layer and the spacer of the OLED display substrate are formed at the same time by using the same single patterning process, it is necessary to modify a conventional mask for preparing the spacer of the OLED display substrate by adding a mask pattern for preparing the insulating layer.

In the technical solution of this embodiment, the phenomenon of the jagged shape at a peripheral edge of the circular effective display area can be improved without increasing much workload, and the technical solution of this embodiment is not limited to realizing the circular effective display area, but can provide an effective display area of any shape. Moreover, after practical verification, it has been proved that the display effect is very desirable. The technical solution of this embodiment is applicable to any effective display area having a boundary extending along a non-linear trace. To be specific, the effective display area may be circular or annular. Of course, the effective display area may alternatively have any other shape, such as a rectangle with rounded corners, an arc and a hexagon.

Specifically, in the technical solution of this embodiment, the sub-pixels may be rectangular. Of course, the shape of the sub-pixels is not limited to the rectangle, and may be other shapes, such as a diamond and a circle.

In a specific embodiment, a method for manufacturing an OLED display substrate includes the following steps.

In step 1, a base substrate is provided and a buffer layer is formed on the base substrate. The base substrate may be a rigid or flexible substrate. The rigid substrate may be a glass substrate or a quartz substrate, and the flexible substrate may be a polyimide film. The buffer layer can be made of a material selected from oxides, nitrides, or oxynitrides.

In step 2, a pattern of an active layer is formed. Specifically, a layer of semiconductor material is deposited, and a layer of photoresist is applied on the semiconductor material and then exposed by using a mask so as to form a photoresist-reserved region, which corresponds to a region where the pattern of the active layer is located, and a photoresist-unreserved region, which corresponds to a region of the semiconductor material layer other than the pattern. Thereafter, development is carried out such that the photoresist in the photoresist-unreserved region is completely removed, and the photoresist in the photoresist-reserved region remains unchanged in thickness. The semiconductor material in the photoresist-unreserved region is completely etched off by an etching process, and the remaining photoresist is then removed to form the pattern of the active layer.

In step 3, a first insulating layer is formed. The first insulating layer can be made of a material selected from an oxide, a nitride or an oxy-nitride, or can be made of an organic resin.

In step 4, patterns of a gate electrode and a gate line are formed. Specifically, a gate metal layer having a thickness of about 500 to 4000 Angstroms can be deposited by sputtering or thermal evaporation, and can be made of a metal such as Cu, Al, Ag, Mo, Cr, Nd, Ni, Mn, Ti, Ta, and W, and alloys of these metals. The gate metal layer can have a single-layered structure or a multi-layered structure, such as Cu \ Mo, Ti \ Cu \ Ti, and Mo \ Al \ Mo. A layer of photoresist is applied on the gate metal layer and then exposed by using a mask so as to form a photoresist-reserved region, which corresponds to a region where the patterns of the gate electrode and the gate line are located, and a photoresist-unreserved region, which corresponds to a region of the gate metal layer other than the patterns. Thereafter, development is carried out such that the photoresist in the photoresist-unreserved region is completely removed, and the photoresist in the photoresist-reserved region remains unchanged in thickness. The gate metal film in the photoresist-unreserved region is completely etched off by an etching process, and the remaining photoresist is then removed to form the patterns of the gate line and the gate electrode.

In step 5, a second insulating layer is formed. The second insulating layer can be made of a material selected from an oxide, a nitride or an oxy-nitride, or can be made of an organic resin.

In step 6, patterns of a data line, a source electrode, and a drain electrode are formed. Specifically, a source and drain metal layer having a thickness of about 2000 to 4000 Angstroms can be deposited by magnetron sputtering, thermal evaporation, or other film forming methods, and can be made of a metal such as Cu, Al, Ag, Mo, Cr, Nd, Ni, Mn, Ti, Ta, and W, and alloys of these metals. The source and drain metal layer can have a single-layered structure or a multi-layered structure, such as Cu \ Mo, Ti \ Cu \ Ti, and Mo \ Al \ Mo. A layer of photoresist is applied on the source and drain metal layer and then exposed by using a mask so as to form a photoresist-reserved region, which corresponds to a region where the patterns of the source electrode, the drain electrode and the data line are located, and a photoresist-unreserved region, which corresponds to a region of the source and drain metal layer other than the patterns. Thereafter, development is carried out such that the photoresist in the photoresist-unreserved region is completely removed, and the photoresist in the photoresist-reserved region remains unchanged in thickness. The source and drain metal layer in the photoresist-unreserved region is completely etched off by an etching process, and the remaining photoresist is then removed to form the patterns of the drain electrode, the source electrode and the gate line.

In step 7, a third insulating layer is formed. The third insulating layer can be made of a material selected from an oxide, a nitride or an oxy-nitride, or can be made of an organic resin.

In step 8, an anode is formed. Specifically, a transparent conductive layer having a thickness of about 300 to 1500 Angstroms can be deposited by sputtering or thermal evaporation, and can be made of ITO, IZO, or other transparent metal oxide. A layer of photoresist is applied on the transparent conductive layer, and then exposed by using a mask so as to form a photoresist-reserved region, which corresponds to a region where a pattern of the anode is located, and a photoresist-unreserved region, which corresponds to a region of the transparent conductive layer other than the pattern. Thereafter, development is carried out such that the photoresist in the photoresist-unreserved region is completely removed, and the photoresist in the photoresist-reserved region remains unchanged in thickness. The transparent conductive film in the photoresist-unreserved region is completely etched off by an etching process, and the remaining photoresist is then removed to form the pattern of anode.

In step 9, a pattern of a pixel-defining layer is formed. Specifically, a material of the pixel-defining layer can be deposited by magnetron sputtering, thermal evaporation, PECVD or other film forming methods. The material of the pixel-defining layer can be selected from an oxide, a nitride or an oxy-nitride. The pattern of the pixel-defining layer can be formed by a patterning process, and the pixel-defining layer defines a plurality of sub-pixels.

In step 10, an insulating layer is formed. Specifically, an insulating material can be deposited by magnetron sputtering, thermal evaporation, PECVD, or other film forming methods. The insulating material can be selected from an oxide, a nitride or an oxy-nitride. A pattern of the insulating layer is formed by a patterning process, and the insulating layer covers the anode outside the effective display area.

In step 11, a pattern of a spacer is formed. Specifically, a spacer material can be deposited by magnetron sputtering, thermal evaporation, PECVD, or other film forming methods. The spacer material can be selected from an oxide, a nitride, or an oxynitride, and the pattern of the spacer is formed by a patterning process.

In step 12, an organic light-emitting layer is formed. Specifically, a hole injection layer, a hole transport layer, a light-emitting layer, an electron transport layer, and an electron injection layer can be sequentially formed by vapor deposition.

In step 13, a cathode is formed. Specifically, a metal material can be deposited on an entire surface to form a cathode, which can be made of Ag or Al.

In this embodiment, the insulating layer and the spacer are separately formed through two patterning processes. Optionally, in order to reduce the number of patterning processes, the insulating layer and the spacer can be formed in a single patterning process.

In the various embodiments of the methods of the present disclosure, sequence numbers of the steps cannot be used to define the sequence of the steps. For those of ordinary skill in the art, variations in the sequence of the steps can be made without paying any creative work, and also fall within the scope of this disclosure.

Technical or scientific terms used in the present disclosure shall have ordinary meanings understood by those having ordinary skills in the art to which the present disclosure pertains, unless otherwise defined. The terms "first", "second", and the like used herein are not intended to indicate any order, quantity, or importance, but are used to distinguish different components from each other. The term "including", "comprising", or any similar variety is intended to specify that the element or item stated before these terms encompasses the elements or items and equivalents thereof listed after these terms, but do not preclude the other elements or items. The phrases "connected", "connecting", etc. are not limited to a physical or mechanical connection, but may also include an electrical connection, either direct or indirect. The terms "up", "down", "left", "right", etc., are merely used to indicate a relative positional relationship, and if the absolute position of the described object is changed, the relative positional relationship will be changed accordingly.

It will be understood that when an element such as a layer, a film, a region, or a substrate is mentioned to be "on" or "under" another element, it can be "directly" "on" or "under" the other element, or there can be one or more intermediate elements.

The above are optional embodiments of the present disclosure. It should be noted that, for those of ordinary skill in the art, several improvements and modifications can be made without departing from the principles described in the present disclosure, and shall also be regarded as falling within the protection scope of the present disclosure.

What is claimed is:

1. A display substrate, comprising a plurality of sub-pixels, which comprises one or more first sub-pixels located in an effective display area of the display substrate, and one or more second sub-pixels located at a boundary of the effective display area of the display substrate, wherein the one or more second sub-pixels comprises a first portion in the effective display area and a second portion outside the effective display area, and the second portion does not emit light when the display substrate is performing display.

2. The display substrate according to claim 1, wherein the display substrate is an Organic Light-Emitting Diode (OLED) display substrate.

3. The display substrate according to claim 1, wherein each of the plurality of sub-pixels comprises an anode, a cathode, and an organic light-emitting layer located between the anode and the cathode, and in the second portion, the anode and the organic light-emitting layer are separated from each other by an insulating layer.

4. The display substrate according to claim 1, wherein each of the plurality of sub-pixels comprises an anode, a cathode, and an organic light-emitting layer located between the anode and the cathode, and in the second portion, the cathode and the organic light-emitting layer are separated from each other by an insulating layer.

5. The display substrate according to claim 3, wherein the insulating layer comprises a light-shielding material.

6. The display substrate according to claim 5, wherein the insulating layer comprises an organic resin material.

7. The display substrate according to claim 3, wherein the insulating layer is in a same layer and made of a same material as a spacer of the display substrate.

8. The display substrate according to claim 1, wherein the effective display area has a boundary extending along a non-linear trace.

9. The display substrate according to claim 8, wherein the effective display area has a shape of a circle, an oval, a ring, a rectangle with rounded corners, an arc, or a hexagon.

10. The display substrate according to claim 1, wherein the plurality of sub-pixels are rectangular, square, diamond-shaped, or circular.

11. A display device comprising a display substrate, the display substrate comprising a plurality of sub-pixels, which comprises one or more first sub-pixels located in an effective display area of the display substrate, and one or more second sub-pixels located at a boundary of the effective display area of the display substrate, wherein the one or more second sub-pixels comprises a first portion in the effective display area and a second portion outside the effective display area, and the second portion does not emit light when the display substrate is performing display.

12. The display device according to claim 11, wherein the display substrate is an OLED display substrate, and the display device is an OLED display device.

13. A method for manufacturing a display substrate comprising a plurality of sub-pixels, each of which comprises an anode, a cathode, and an organic light-emitting layer located between the anode and the cathode, wherein the plurality of sub-pixels comprises one or more first sub-pixels located in an effective display area of the display substrate, and one or more second sub-pixels located at a boundary of the effective display area of the display substrate, and the one or more second sub-pixels comprises a first portion in the effective display area and a second portion outside the effective display area, and the second portion does not emit light when the display substrate is performing display;

the method for manufacturing the display substrate comprising:
forming an insulating layer between the anode and the organic light-emitting layer in the second portion; and/or
forming an insulating layer between the cathode and the organic light-emitting layer in the second portion.

14. The method for manufacturing a display substrate according to claim 13, wherein the display substrate is an OLED display substrate.

15. The method for manufacturing a display substrate according to claim 13, wherein the insulating layer and a spacer of the display substrate are formed by a single patterning process.

16. The method for manufacturing a display substrate according to claim 13, wherein the insulating layer is formed after a pixel-defining layer of the display substrate has been formed, when in the second portion, the insulating layer is located between the anode and the organic light-emitting layer.

17. The method for manufacturing a display substrate according to claim 13, wherein the insulating layer is formed after the organic light-emitting layer has been formed and before the cathode is to be formed, when in the second portion, the insulating layer is located between the cathode and the organic light-emitting layer.

18. The display substrate according to claim 1, wherein each of the plurality of sub-pixels comprises an anode and a cathode, anode in the first and second portions is independent of each other, and the anode in the first portion is connected to a driving thin film transistor, and the anode in the second portion is not connected to the driving thin film transistor.

19. The display substrate according to claim 1, wherein each of the plurality of sub-pixels comprises an anode and a cathode, cathode in the first and second portions is independent of each other, and the cathode in the first portion is connected to a signal line, and the cathode in the second portion is not connected to the signal line.

20. The display device according to claim 11, wherein the display device is of a square display device with rounded corners.

* * * * *